United States Patent
Arai et al.

(10) Patent No.: US 6,296,954 B1
(45) Date of Patent: *Oct. 2, 2001

(54) ORGANIC ELECTROLUMINESCENT DEVICE

(75) Inventors: Michio Arai; Isamu Kobori; Etsuo Mitsuhashi, all of Tokyo (JP)

(73) Assignee: TDK Corporation, Tokyo (JP)

( * ) Notice: Subject to any disclaimer, the term of this patent is extended or adjusted under 35 U.S.C. 154(b) by 0 days.

This patent is subject to a terminal disclaimer.

(21) Appl. No.: 09/235,379

(22) Filed: Jan. 22, 1999

(30) Foreign Application Priority Data

Dec. 7, 1998 (JP) .................................................. 10-363790

(51) Int. Cl.⁷ .................................................. H05B 33/00
(52) U.S. Cl. ..................... 428/690; 313/504; 313/503; 313/502; 313/506; 428/917
(58) Field of Search ..................... 428/690, 917; 313/502, 503, 504, 506; 257/100

(56) References Cited

U.S. PATENT DOCUMENTS

| | | |
|---|---|---|
| 5,853,905 | 12/1998 | So et al. . |
| 5,869,929 * | 2/1999 | Eida et al. ............................. 313/501 |
| 5,952,779 | 9/1999 | Arai et al. ............................. 313/504 |
| 5,969,474 | 10/1999 | Arai ...................................... 313/504 |
| 5,981,092 | 11/1999 | Arai et al. ............................. 428/690 |
| 6,166,488 * | 12/2000 | Arai ...................................... 313/504 |

FOREIGN PATENT DOCUMENTS

| | | |
|---|---|---|
| 0 668 620 | 8/1995 | (EP) . |
| 0 740 489 | 10/1996 | (EP) . |
| 5-3080 | 1/1993 | (JP) . |
| 9-17574 | 1/1997 | (JP) . |
| 9-260062 | 10/1997 | (JP) . |
| WO 97/42666 | 11/1997 | (WO) . |
| WO 98/10473 | 3/1998 | (WO) . |
| WO 00/10366 | 2/2000 | (WO) . |

* cited by examiner

Primary Examiner—Marie Yamnitzky
Assistant Examiner—Dawn L. Garrett
(74) Attorney, Agent, or Firm—Oblon, Spivak, McClelland, Maier & Neustadt, P.C.

(57) ABSTRACT

The invention provides an organic EL device comprising a substrate, a hole injecting electrode and a negative electrode formed on the substrate, a light emitting layer containing an organic material between the electrodes, an inorganic electron injecting and transporting layer between the light emitting layer and the negative electrode, and an inorganic insulative hole injecting and transporting layer between the light emitting layer and the hole injecting electrode. The inorganic electron injecting and transporting layer contains at least one oxide selected from among strontium oxide, magnesium oxide, calcium oxide, lithium oxide, rubidium oxide, potassium oxide, sodium oxide, and cesium oxide as a main component and silicon oxide and/or germanium oxide as a stabilizer. The inorganic insulative hole injecting and transporting layer (4) contains silicon oxide and/or germanium oxide as a main component, the main component having an average composition represented by the formula:

$$(Si_{1-x}Ge_x)O_y$$

wherein $0 \leq x \leq 1$ and $1.7 \leq y \leq 1.99$, as analyzed by Rutherford back-scattering. Organic EL devices having performance comparable to or more than that of prior art devices having a hole injecting and transporting layer or an electron injecting and transporting layer using organic materials, a long life, weather resistance, high stability, high efficiency, and low cost are realized. The devices are easy to manufacture and have stable physical properties at the film interface even when the light emitting layer consists of two or more layers.

7 Claims, 2 Drawing Sheets

ORGANIC ELECTROLUMINESCENT DEVICE

BACKGROUND OF THE INVENTION

1. Technical Field

This invention relates to an organic electroluminescent (EL) device and more particularly, to an inorganic/organic junction structure suitable for use in a device of the type wherein an electric field is applied to a thin film of an organic compound to emit light.

2. Background Art

In general, organic EL devices have a basic configuration including a glass substrate, a transparent electrode of ITO etc., a hole transporting layer of an organic amine compound, an organic light emitting layer of a material exhibiting electronic conductivity and intense light emission such as Alq3, and an electrode of a low work function metal such as MgAg, wherein the layers are stacked on the substrate in the described order.

The device configurations which have been reported thus far have one or more organic compound layers interposed between a hole injecting electrode and an electron injecting electrode. The organic compound layers are typically of two- or three-layer structure.

Included in the two-layer structure are a structure having a hole transporting layer and a light emitting layer formed between the hole injecting electrode and the electron injecting electrode and another structure having a light emitting layer and an electron transporting layer formed between the hole injecting electrode and the electron injecting electrode. Included in the three-layer structure is a structure having a hole transporting layer, a light emitting layer, and an electron transporting layer formed between the hole injecting electrode and the electron injecting electrode. Also known is a one-layer structure wherein a single layer playing all the roles is formed from a polymer or a mixed system.

FIGS. 2 and 3 illustrate typical configurations of organic EL devices.

In FIG. 2, a hole transporting layer 14 and a light emitting layer 15 of organic compounds are formed between a hole injecting electrode 12 and an electron injecting electrode 13 on a substrate 11. In this configuration, the light emitting layer 15 also serves as an electron transporting layer.

In FIG. 3, a hole transporting layer 14, a light emitting layer 15, and an electron transporting layer 16 of organic compounds are formed between a hole injecting electrode 12 and an electron injecting electrode 13 on a substrate 11.

Reliability is a common problem to be solved for these organic EL devices. More particularly, organic EL devices in principle have a hole injecting electrode and an electron injecting electrode and need organic layers for effectively injecting and transporting holes and electrons from the electrodes, respectively. However, the materials of which the organic layers are formed are vulnerable during manufacture and have less affinity to the electrodes. Since the electron injecting electrode for injecting electrons must be formed of a metal having a low work function, such materials as MgAg and AlLi must be used. These materials, however, are readily oxidizable and unstable, becoming the serious factor that governs the life of organic EL devices and gives rise to a reliability problem. Another problem is raised by the significantly accelerated degradation of organic thin films as compared with light-emitting diodes (LED) and laser diodes (LD).

Also, most organic materials are relatively expensive. Any partial replacement of constituent films by an inexpensive inorganic material would give an economical merit in the manufacture of cost effective organic EL device-applied products.

There is also a desire to develop a device having a further improved luminous efficiency, a lower drive voltage and a less current consumption.

To solve this and other problems, a means for taking advantage of both an organic material and an inorganic semiconductor material has been devised. That is, an organic/inorganic semiconductor junction is established by substituting an inorganic p-type semiconductor for the organic hole transporting layer. These efforts are found in Japanese Patent No. 2636341, JP-A 139893/1990, 207488/1990, and 119973/1994. It was impossible to design EL devices which are superior in light emission properties and reliability to prior art organic EL devices.

SUMMARY OF THE INVENTION

An object of the present invention is to provide an organic EL device which exhibits performance equal to or greater than that of prior art devices having a hole injecting and transporting layer or an electron injecting and transporting layer using organic materials, and has a long life, weather resistance, high stability, high efficiency, and low cost.

This and other objects are achieved by the construction that is defined below.

(1) An organic electroluminescent device comprising
 a substrate,
 a hole injecting electrode and a negative electrode formed on the substrate,
 a light emitting layer containing an organic material between the electrodes,
 an inorganic electron injecting and transporting layer between said light emitting layer and said negative electrode, and
 an inorganic insulative hole injecting and transporting layer between said light emitting layer and said hole injecting electrode,
 said inorganic electron injecting and transporting layer comprising at least one oxide selected from the group consisting of strontium oxide, magnesium oxide, calcium oxide, lithium oxide, rubidium oxide, potassium oxide, sodium oxide, and cesium oxide as a main component,
 said inorganic insulative hole injecting and transporting layer comprising silicon oxide or germanium oxide or a mixture of silicon oxide and germanium oxide as a main component, the main component having an average composition represented by the formula:

$$(Si_{1-x}Ge_x)O_y$$

wherein $0 \leq x \leq 1$ and $1.7 \leq y \leq 1.99$, as analyzed by Rutherford back-scattering.

(2) The organic electroluminescent device of (1) wherein said inorganic insulative hole injecting and transporting layer further contains silicon oxide, germanium oxide or a mixture of silicon oxide and germanium oxide as a stabilizer.

(3) The organic electroluminescent device of (1) or (2) wherein said negative electrode is formed of at least one metal element selected from the group consisting of Al, Ag, In, Ti, Cu, Au, Mo, W, Pt, Pd, and Ni.

(4) The organic electroluminescent device of any one of (1) to (3) wherein said inorganic insulative hole injecting layer contains up to 10 at % of at least one element selected from the group consisting of Cu, Fe, Ni, Ru, Sn, and Au.

(5) The organic electroluminescent device of (3) or (4) wherein said inorganic electron injecting and transporting layer contains 80 to 99 mol % of the main component and 1 to 20 mol % of the stabilizer, based on the entire components.

(6) The organic electroluminescent device of any one of (1) to (5) wherein said inorganic electron injecting and transporting layer has a thickness of 0.1 to 2 nm.

(7) The organic electroluminescent device of any one of (1) to (6) wherein said inorganic insulative hole injecting and transporting layer has a thickness of 0.1 to 5 nm. organic EL devices are realized.

DESCRIPTION OF PREFERRED EMBODIMENTS

Figure 1:
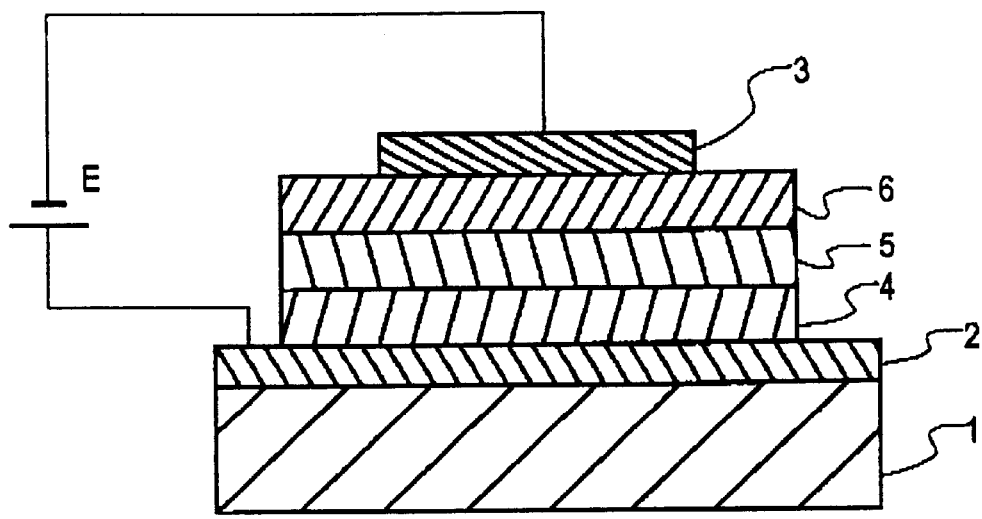
FIG. 1 is a schematic cross-sectional view illustrating the configuration of an organic EL device according to the invention.
Figure 2:
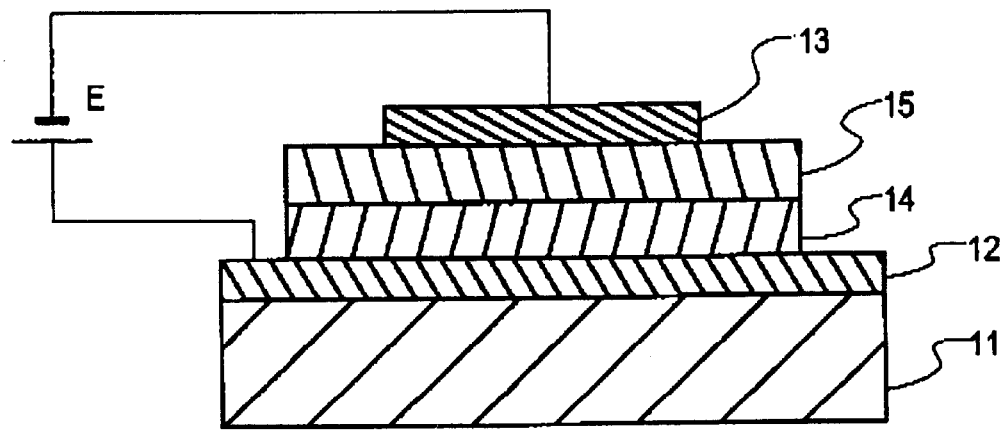
FIG. 2 is a schematic cross-sectional view illustrating the configuration of a prior art organic EL device.
Figure 3:
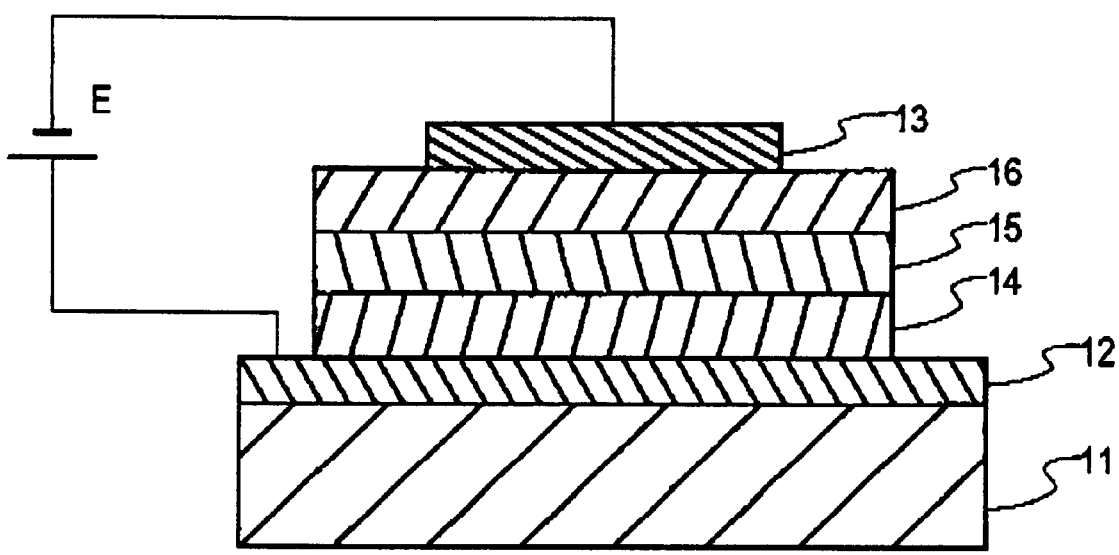
FIG. 3 is a schematic cross-sectional view illustrating the configuration of another prior art organic EL device.

The organic EL device of the invention has a substrate, a hole injecting electrode and a negative electrode formed on the substrate, and a light emitting layer containing an organic material between the electrodes. The device further has an inorganic electron injecting and transporting layer between the light emitting layer and the negative electrode and an inorganic insulative hole injecting and transporting layer between the light emitting layer and the hole injecting electrode. The inorganic electron injecting and transporting layer contains at least one oxide selected from the group consisting of strontium oxide, magnesium oxide, calcium oxide, lithium oxide, rubidium oxide, potassium oxide, sodium oxide, and cesium oxide as a main component and preferably silicon oxide and/or germanium oxide as a stabilizer. The inorganic insulative hole injecting and transporting layer contains silicon oxide and/or germanium oxide as a main component, the main component having an average composition represented by the formula:

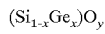

$(Si_{1-x}Ge_x)O_y$ wherein $0 \leq x \leq 1$ and $1.7 \leq y \leq 1.99$, as analyzed by Rutherford back-scattering.

By providing the inorganic electron injecting and transporting layer and the inorganic insulative hole injecting and transporting layer both of inorganic materials and locating the light emitting layer therebetween, the organic EL device can be given both the advantages of inorganic material and the advantages of organic material. Specifically, since the interfaces of the light emitting layer with the electron injection layer and the hole injecting and transporting layer are stabilized in physical properties, the manufacture of EL devices becomes easy. The organic EL device of the invention produces a luminance equal to or greater than that of prior art devices having an organic hole injecting layer and an organic electron injecting layer. Owing to high heat resistance and weather resistance, the organic EL device of the invention has a longer service life than the prior art devices and develops minimal leaks and dark spots. The use of inexpensive, readily available inorganic materials rather than relatively expensive organic materials offers the advantages of easy manufacture and a reduced manufacture cost.

The inorganic insulative hole injecting and transporting layer has the functions of facilitating injection of holes from the hole injecting electrode, transporting holes stably and obstructing electrons, and the inorganic electron injecting and transporting layer has the functions of facilitating injection of electrons from the negative electrode, transporting electrons stably, and obstructing holes. These layers are effective for increasing the number of holes and electrons injected into the light emitting layer and confining holes and electrons therein for optimizing the recombination region to improve luminous efficiency.

Specifically, since the inorganic electron injecting and transporting layer is constructed from the above-mentioned main component and optional component, it becomes unnecessary to form a special electrode having an electron injecting function, and a metal electrode having a relatively high stability and good conductivity may be used. And the electron injection and transportation efficiency of the inorganic electron injecting and transporting layer is improved and the life of the device is extended. Also the oxide as the main component of the inorganic insulative hole injecting and transporting layer is made oxygen poor to create oxygen vacancies, which allows effective injection of holes from the hole injecting electrode to the organic layer on the light emitting layer side. Additionally, the migration of electrons from the organic layer to the hole injecting electrode is restrained, ensuring effective recombination of holes and electrons in the light emitting layer.

The inorganic electron injecting and transporting layer contains at least one oxide selected from the group consisting of lithium oxide ($Li_2O$), rubidium oxide ($Rb_2O$), potassium oxide ($K_2O$), sodium oxide ($Na_2O$), cesium oxide ($Cs_2O$), strontium oxide (SrO), magnesium oxide (MgO), and calcium oxide (CaO) as the main component. These oxides may be used alone or in admixture of two or more. The mixture of two or more oxides may have an arbitrary mix ratio. Of these oxides, strontium oxide is most preferred; magnesium oxide, calcium oxide and lithium oxide ($Li_2O$) are more preferable in the described order; and in the next place, rubidium oxide ($Rb_2O$), and further in the next place, potassium oxide ($K_2O$) and sodium oxide ($Na_2O$) are preferable. When these oxides are used in admixture, the mixture should preferably contain at least 40 mol %, especially at least 50 mol % of strontium oxide or at least 40 mol %, especially at least 50 mol % of lithium oxide and rubidium oxide combined.

The inorganic electron injecting and transporting layer preferably contains silicon oxide ($SiO_2$) and/or germanium oxide ($GeO_2$) as the stabilizer. Either one or both of silicon oxide and germanium oxide may be used. The mixture of silicon oxide and germanium oxide may have an arbitrary mix ratio.

These oxides are generally present in stoichiometric composition, but may deviate more or less therefrom and take non-stoichiometric compositions.

Also preferably, the inorganic electron injecting and transporting layer according to the invention contains the respective components in the following amounts:

main component: 80 to 99 mol %, more preferably 90 to 95 mol %, stabilizer: 1 to 20 mol %, more preferably 5 to 10 mol %, based on the entire components, provided that the respective components are calculated as SrO, MgO, CaO, $Li_2O$, $Rb_2O$, $K_2O$, $Na_2O$, $Cs_2O$, $SiO_2$, and $GeO_2$.

The inorganic electron injecting and transporting layer preferably has a thickness of 0.1 to 2 nm, more preferably 0.3 to 0.8 nm.

The inorganic insulative hole injecting layer contains silicon oxide and/or germanium oxide as the main component.

Preferably the main component oxide has an average composition represented by the formula:

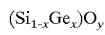
$(Si_{1-x}Ge_x)O_y$ wherein $0 \leq x \leq 1$ and $1.7 \leq y \leq 1.99$), $(Si_{1-x}Ge_x)O_y$, as analyzed by Rutherford back-scattering.

By controlling the oxide as the main component of the inorganic insulative hole injecting and transporting layer so as to fall in the above-defined compositional range, it becomes possible to effectively inject holes from the hole injecting electrode to the organic layer on the light emitting layer side. Additionally, the migration of electrons from the organic layer to the hole injecting electrode is restrained, ensuring effective recombination of holes and electrons in the light emitting layer. Since hole injection and transportation is intended, no light emission occurs with a reverse bias voltage applied. The organic EL device of the invention is effectively applicable to displays of the time-division drive mode which are required to produce a high emission luminance and has both the advantages of inorganic material and the advantages of organic material. The organic EL device of the invention produces a luminance comparable to that of prior art devices having an organic hole injecting layer. Owing to high heat resistance and weather resistance, the organic EL device of the invention has a longer service life than the prior art devices and develops minimal leaks and dark spots. The use of inexpensive, readily available inorganic materials rather than relatively expensive organic materials offers the advantages of easy manufacture and a reduced manufacture cost.

In the formula, y representative of the oxygen content is in the above range, that is, from 1.7 to 1.99. If y is outside this range, the layer has a reduced hole injecting capability, leading to a drop of luminance. Preferably y is from 1.85 to 1.98.

The inorganic insulative hole injecting and transporting layer may be a thin film of silicon oxide, germanium oxide, or a mixture of silicon oxide and germanium oxide. In the formula, x representative of the germanium to silicon ratio is $0 \leq x \leq 1$. Preferably x is up to 0.4, more preferably up to 0.3, especially up to 0.2.

Alternatively, x is preferably at least 0.6, more preferably at least 0.7, especially at least 0.8.

The oxygen content is given as an average value for the film as analyzed by Rutherford back-scattering although the measurement method is not limited thereto insofar as measurement is made at an equivalent precision.

Preferably the hole injecting layer further contains at least one element selected from among copper, iron, nickel, ruthenium, tin, and gold. Preferably it contains copper, nickel or tin, especially nickel. The content of these elements is preferably up to 10 at %, more preferably 0.05 to 10 at %, further preferably 0.1 to 10 at %, especially 0.5 to 5 at %. If the content is more than this range, the layer would have a reduced hole injecting capability. When two or more of these elements are used, the total content should preferably fall in the above-described range.

In addition, the hole injecting layer may contain as impurities Ne, Ar, Kr and Xe used as the sputtering gas, preferably in a total content of up to 10 at %, more preferably 0.01 to 2% by weight, especially 0.05 to 1.5% by weight. These elements may be contained alone or in admixture of two or more. The mixture may be of two or more impurity elements in an arbitrary ratio.

These elements are used as the sputtering gas and thus introduced into the inorganic insulative hole injecting and transporting layer during its formation. If the content of these elements is too high, the trapping effect is extremely lowered and hence, the desired performance is lost.

The content of the sputtering gas is determined by the pressure, the flow rate ratio of sputtering gas to oxygen, deposition rate, and other factors during film formation, especially the pressure during film formation. In order that the content of the sputtering gas fall within the above-described range, it is preferred to effect film deposition in higher vacuum, specifically in a vacuum of 1 Pa or lower, especially 0.1 to 1 Pa.

As long as the overall hole injecting layer has the above-described composition on the average, the composition of the hole injecting layer need not be uniform. A layer structure having a graded concentration in a thickness direction is acceptable. In this case, the hole injecting layer is preferably oxygen poorer on the interface side with the organic layer (or light emitting layer).

The inorganic insulative hole injecting layer is normally amorphous.

The thickness of the inorganic insulative hole injecting layer is not critical although an appropriate thickness is about 0.05 nm to about 10 nm, more preferably about 1 to about 5 nm or about 0.5 to about 3 nm. Hole injection would become insufficient when the thickness of the hole injecting layer is outside the range.

Methods for preparing the inorganic electron injecting and transporting layer and the inorganic insulative hole injecting and transporting layer include various physical and chemical thin film formation methods such as sputtering and electron beam (EB) evaporation, with the sputtering being preferred.

When the inorganic electron injecting and transporting layer and the inorganic insulative hole injecting layer are formed by sputtering, the sputtering gas is preferably under a pressure of 0.1 to 1 Pa during sputtering. The sputtering gas may be any of inert gases used in conventional sputtering equipment, for example, Ar, Ne, Xe, and Kr. Nitrogen ($N_2$) gas may be used if necessary. Reactive sputtering may be carried out using the sputtering atmosphere of the sputtering gas mixed with about 1 to about 99% of oxygen ($O_2$) gas. The target used herein is the above-described oxide or oxides, and either single source or multiple source sputtering may be carried out.

The sputtering process may be an RF sputtering process using an RF power source or a DC reactive sputtering process, with the RF sputtering being especially preferred. The power of the sputtering equipment is preferably in the range of 0.1 to 10 W/cm$^2$ for RF sputtering. The deposition rate is in the range of 0.5 to 10 nm/min., preferably 1 to 5 nm/min. The temperature of the substrate during deposition is from room temperature (25° C.) to about 150° C.

Reactive sputtering is also acceptable. The reactive gas used therefor may be $N_2$, $NH_3$, NO, $NO_2$, $N_2O$ or the like when it is desired to incorporate nitrogen and $CH_4$, $C_2H_2$, CO or the like when it is desired to incorporate carbon. These reactive gases may be used alone or in admixture of two or more.

By providing the inorganic insulative hole injecting and transporting layer and the inorganic electron injecting and transporting layer, the organic EL device of the invention is improved in heat resistance and weather resistance and its service life is extended. The use of inexpensive, readily available inorganic materials rather than relatively expensive organic materials offers the advantages of easy manufacture and a reduced manufacture cost. Moreover, this improves the connection of such layers to the electrodes of inorganic materials which is a problem in the prior art, and as a consequence, restrains the generation of leak current and the development of dark spots.

Disposed on the inorganic electron injecting and transporting layer (on its side opposite to the light emitting layer) is the negative electrode. When combined with the inorganic electron injecting and transporting layer to be described below, the negative electrode need not have a low work function and electron injecting ability and need not be specifically limited. Common metals may be used. Among others, one or more metal elements selected from among Al, Ag, In, Ti, Cu, Au, Mo, W, Pt, Pd, and Ni, especially Al and Ag are preferred from the standpoints of conductivity and ease of handling.

The negative electrode thin film may have at least a sufficient thickness to supply electrons to the inorganic electron injecting and transporting layer, for example, a thickness of at least 50 nm, preferably at least 100 nm. Although the upper limit is not critical, the electrode thickness may typically be about 50 to about 500 nm.

Although the organic EL device of the invention favors to use the above-mentioned metal elements as the negative electrode combined with the inorganic electron injecting and transporting layer to be described below, any of the following materials may also be used as needed. Exemplary materials include metal elements such as K, Li, Na, Mg, La, Ce, Ca, Sr, Ba, Sn, Zn, and Zr, and binary or ternary alloys containing such metal elements for stability improvement, for example, Ag-Mg (Ag: 0.1 to 50 at %), Al-Li (Li: 0.01 to 14 at %), In-Mg (Mg: 50 to 80 at %), and Al-Ca (Ca: 0.01 to 20 at %).

The electron injecting electrode thin film may have at least a sufficient thickness to effect electron injection, for example, a thickness of at least 0.1 nm, preferably at least 0.5 nm, more preferably at least 1 nm. Although the upper limit is not critical, the electrode thickness is typically about 1 to about 500 nm. On the electron injecting electrode, an auxiliary or protective electrode may be provided.

The auxiliary electrode may have at least a sufficient thickness to ensure efficient electron injection and prevent the ingress of moisture, oxygen and organic solvents, for example, a thickness of at least 50 nm, preferably at least 100 nm, more preferably 100 to 500 nm. A too thin auxiliary electrode layer would exert its effect little, lose a step coverage capability, and provide insufficient connection to a terminal electrode. If too thick, greater stresses are generated in the auxiliary electrode layer, accelerating the growth rate of dark spots.

For the auxiliary electrode, an appropriate material may be chosen in consideration of the material of the electron injecting electrode to be combined therewith. For example, low resistivity metals such as aluminum may be used when electron injection efficiency is of importance. Metal compounds such as TiN may be used when sealing is of importance.

The thickness of the electron injecting electrode and the auxiliary electrode combined is usually about 50 to about 500 nm though it is not critical.

For the hole injecting electrode, materials capable of effectively injecting holes into the hole injecting layer are preferred, with those materials having a work function of 4.5 to 5.5 eV being especially preferred. Useful are compositions based on tin-doped indium oxide (ITO), zincdoped indium oxide (IZO), indium oxide ($In_2O_3$), tin oxide ($SnO_2$) or zinc oxide (ZnO). These oxides may deviate more or less from their stoichiometric compositions. An appropriate proportion of $SnO_2$ mixed with $In_2O_3$ is about 1 to 20%, more preferably about 5 to 12% by weight. For IZO, an appropriate proportion of ZnO mixed with $In_2O_3$ is about 12 to 32% by weight.

The hole injecting electrode may further contain silicon oxide ($SiO_2$) for adjusting the work function. The content of silicon oxide ($SiO_2$) is preferably about 0.5 to 10% as expressed in mol percent of $SiO_2$ based on ITO. The work function of ITO is increased by incorporating $SiO_2$.

The electrode on the light exit side should preferably have a light transmittance of at least 50%, more preferably at least 60%, further preferably at least 70% in the light emission band, typically from 400 to 700 nm, and especially at each light emission. With a lower transmittance, the light emitted by the light emitting layer is attenuated through the electrode, failing to provide a luminance necessary as a light emitting device.

Preferably the electrode has a thickness of 50 to 500 nm, especially 50 to 300 nm. Although the upper limit of the electrode thickness is not critical, a too thick electrode would cause a drop of transmittance and separation. Too thin an electrode is insufficient for its effect and low in film strength during fabrication.

As shown in FIG. 1, for example, the organic EL device of the invention may have the successively stacked configuration of substrate 1/hole injecting electrode 2/inorganic insulative hole injecting and transporting layer 4/light emitting layer 5/inorganic electron injecting layer 6/negative electrode 3. In FIG. 1, a drive power supply E is connected between the hole injecting electrode 2 and the negative electrode 3. Also acceptable is an inversely stacked configuration obtained by reversing the order of staking.

The stacking configuration may be selected as appropriate for the desired performance or end use of the device or any appropriate alteration may be made thereon if necessary.

The light emitting layer is a thin film of an organic compound participating in light emission or a multilayer film of two or more organic compounds participating in light emission. Better results are obtained with the construction of the invention when the light emitting layer is a stack of two or more layers.

The light emitting layer has the functions of injecting holes and electrons, transporting them, and recombining holes and electrons to create excitons. It is preferred that relatively electronically neutral compounds be used in the light emitting layer so that electron and holes may be readily injected and transported in a well-balanced manner.

The light emitting layer may include a hole transporting layer and an electron transporting layer in addition of a light emitting layer of narrow definition if desired although usually these layers are not employed.

The thickness of the light emitting layer is not critical and varies with a particular formation technique although its thickness is usually preferred to range from about 5 nm to about 500 nm, especially about 10 nm to about 300 nm.

The light emitting layer of the organic EL device contains a fluorescent material that is a compound having a light emitting function. The fluorescent material may be at least one member selected from compounds as disclosed, for example, in JP-A 264692/1988, such as quinacridone, rubrene, and styryl dyes. Also, quinoline derivatives such as metal complex dyes having 8-quinolinol or a derivative thereof as the ligand such as tris(8-quinolinolato)aluminum are included as well as tetraphenylbutadiene, anthracene, perylene, coronene, and 12-phthaloperinone derivatives. Further useful are the phenylanthracene derivatives described in JP-A 12600/1996 (Japanese Patent Application No. 110569/1994) and the tetraarylethene derivatives described in JP-A 12969/1996 (Japanese Patent Application No. 114456/1994).

It is preferred to use such a compound in combination with a host material capable of light emission by itself, that is, to use the compound as a dopant. In this embodiment, the content of the compound in the light emitting layer is preferably 0.01 to 10% by weight, especially 0.1 to 5% by weight. By using the compound in combination with the host material, the light emission wavelength of the host material can be altered, allowing light emission to be shifted to a longer wavelength and improving the luminous efficiency and stability of the device.

As the host material, quinolinolato complexes are preferable, with aluminum complexes having 8-quinolinol or a derivative thereof as the ligand being more preferable. These aluminum complexes are disclosed in JP-A 264692/1988, 255190/1991, 70733/1993, 258859/1993 and 215874/1994.

Illustrative examples include tris(8-quinolinolato) aluminum, bis(8-quinolinolato)magnesium, bis(benzo{f}-8-quinolinolato)zinc, bis(2-methyl-8-quinolinolato)aluminum oxide, tris(8-quinolinolato)indium, tris(5-methyl-8-quinolinolato)aluminum, 8-quinolinolatolithium, tris(5-chloro-8-quinolinolato)gallium, bis(5-chloro-8-quinolinolato)calcium, 5,7-dichloro-8-quinolinolatoaluminum, tris(5,7-dibromo-8-hydroxyquinolinolato)aluminum, and poly[zinc(II)-bis(8-hydroxy-5-quinolinyl)methane].

Also useful are aluminum complexes having another ligand in addition to 8-quinolinol or a derivative thereof. Examples include bis(2-methyl-8-quinolinolato)(phenolato)aluminum(III), bis(2-methyl-8-quinolinolato)(orthocresolato)aluminum(III), bis(2-methyl-8-quinolinolato)(metacresolato)aluminum(III), bis(2-methyl-8-quinolinolato)(paracresolato)aluminum(III), bis(2-methyl-8-quinolinolato)(ortho-phenylphenolato)aluminum(III), bis(2-methyl-8-quinolinolato)(meta-phenylphenolato)aluminum(III), bis(2-methyl-8-quinolinolato)(para-phenylphenolato)aluminum(III), bis(2-methyl-8-quinolinolato)(2,3-dimethylphenolato)aluminum(III), bis(2-methyl-8-quinolinolato)(2,6-dimethylphenolato)aluminum(III), bis(2-methyl-8-quinolinolato)(3,4-dimethylphenolato)aluminum(III), bis(2-methyl-8-quinolinolato)(3,5-dimethylphenolato)aluminum(III), bis(2-methyl-8-quinolinolato)(3,5-di-tert-butylphenolato) aluminum(III), bis(2-methyl-8-quinolinolato)(2,6-diphenylphenolato)aluminum(III), bis(2-methyl-8-quinolinolato)(2,4,6-triphenylphenolato)aluminum(III), bis(2-methyl-8-quinolinolato)(2,3,6-trimethylphenolato)aluminum(III), bis(2-methyl-8-quinolinolato)(2,3,5,6-tetramethylphenolato)aluminum(III), bis(2-methyl-8-quinolinolato)(1-naphtholato)aluminum(III), bis(2-methyl-8-quinolinolato)(2-naphtholato)aluminum(III), bis(2,4-dimethyl-8-quinolinolato)(orthophenylphenolato)aluminum(III), bis(2,4-dimethyl-8-quinolinolato)(para-phenylphenolato)aluminum(III), bis(2,4-dimethyl-8-quinolinolato)(meta-phenylphenolato) aluminum(III), bis(2,4-dimethyl-8-quinolinolato)(3,5-dimethylphenolato)aluminum(III), bis(2,4-dimethyl-8-quinolinolato)(3,5-di-tert-butylphenolato)aluminum(III), bis(2-methyl-4-ethyl-8-quinolinolato)(para-cresolato)aluminum(III), bis(2-methyl-4-methoxy-8-quinolinolato)(paraphenylphenolato)aluminum(III), bis(2-methyl-5-cyano-8-quinolinolato)(ortho-cresolato)aluminum (III), and bis(2-methyl-6-trifluoromethyl-8-quinolinolato)(2-naphtholato) aluminum(III).

Also acceptable are bis(2-methyl-8-quinolinolato) aluminum(III)-$\mu$-oxo-bis(2-methyl-8-quinolinolato) aluminum(III), bis(2,4-dimethyl-8-quinolinolato)aluminum (III)-$\mu$-oxo-bis(2,4-dimethyl-8-quinolinolato)aluminum (III), bis(4-ethyl-2-methyl-8-quinolinolato)aluminum(III)-$\mu$-oxo-bis(4-ethyl-2-methyl-8-quinolinolato)aluminum(III), bis(2-methyl-4-methoxyquinolinolato)aluminum(III)-$\mu$-oxo-bis(2-methyl-4-methoxyquinolinolato)aluminum(III), bis(5-cyano-2-methyl-8-quinolinolato)aluminum(III)-$\mu$-oxo-bis(5-cyano-2-methyl-8-quinolinolato)aluminum(III), and bis(2-methyl-5-trifluoromethyl-8-quinolinolato) aluminum(III)-$\mu$-oxo-bis(2-methyl-5-trifluoromethyl-8-quinolinolato)aluminum(III).

Other useful host materials are the phenylanthracene derivatives described in JP-A 12600/1996 (Japanese Patent Application No. 110569/1994) and the tetraarylethene derivatives described in JP-A 12969/1996 (Japanese Patent Application No. 114456/1994).

The light emitting layer may also serve as the electron transporting layer. In this case, tris(8-quinolinolato) aluminum etc. are preferably used. These fluorescent materials may be evaporated.

Also, if necessary, the light emitting layer may also be a layer of a mixture of at least one hole injecting and transporting compound and at least one electron injecting and transporting compound, in which a dopant is preferably contained. In such a mix layer, the content of the compound is preferably 0.01 to 20% by weight, especially 0.1 to 15% by weight.

In the mix layer, carrier hopping conduction paths are created, allowing carriers to move through a polarly predominant material while injection of carriers of opposite polarity is rather inhibited, and the organic compound becomes less susceptible to damage, resulting in the advantage of an extended device life. By incorporating the aforementioned dopant in such a mix layer, the light emission wavelength the mix layer itself possesses can be altered, allowing light emission to be shifted to a longer wavelength and improving the luminous intensity and stability of the device.

The hole injecting and transporting compound and electron injecting and transporting compound used in the mix layer may be selected from the hole injecting and transporting compounds and the electron injecting and transporting compounds to be described later, respectively. Inter alia, the hole injecting and transporting compound is preferably selected from amine derivatives having strong fluorescence, for example, triphenyldiamine derivatives which are hole transporting materials, styrylamine derivatives and amine derivatives having an aromatic fused ring.

The electron injecting and transporting compound is preferably selected from quinoline derivatives and metal complexes having 8-quinolinol or a derivative thereof as a ligand, especially tris(8-quinolinolato)aluminum (Alq3). The aforementioned phenylanthracene derivatives and tetraarylethene derivatives are also preferable.

As the hole injecting and transporting compound, amine derivatives having intense fluorescence are useful, for example, the triphenyldiamine derivatives, styrylamine derivatives, and amine derivatives having an aromatic fused ring, exemplified above as the hole transporting compound.

The mix ratio is preferably determined in accordance with the carrier density and carrier mobility of the respective compounds. It is usually preferred that the weight ratio of the hole injecting and transporting compound to the electron injecting and transporting compound range from about 1/99 to about 99/1, more preferably from about 10/90 to about 90/10, especially from about 20/80 to about 80/20.

Also preferably, the thickness of the mix layer ranges from the thickness of a mono-molecular layer to less than the thickness of the organic compound layer. Specifically, the mix layer is preferably 1 to 85 nm, more preferably 5 to 60 nm, especially 5 to 50 nm thick.

Preferably the mix layer is formed by a co-deposition process of evaporating the compounds from distinct sources. If both the compounds have approximately equal or very close vapor pressures or evaporation temperatures, they may be pre-mixed in a common evaporation boat, from which they are evaporated together. The mix layer is preferably a uniform mixture of both the compounds although the compounds can be present in island form. The light emitting layer is generally formed to a predetermined thickness by evaporating an organic fluorescent material or coating a dispersion thereof in a resin binder.

As the hole injecting and transporting compound, use may be made of various organic compounds as described, for example, in JP-A 295695/1988, 191694/1990, 792/1991, 234681/1993, 239455/1993, 299174/1993, 126225/1995, 126226/1995, and 100172/1996, and EP 0650955A1. Exemplary are tetraarylbenzidine compounds (triaryldiamines or triphenyldiamines: TPD), aromatic tertiary amines, hydrazone derivatives, carbazole derivatives, triazole derivatives, imidazole derivatives, oxadiazole derivatives having an amino group, and polythiophenes. These compounds may be used alone or in admixture of two or more. On combined use of two or more of these compounds, they may be formed as separate stacked layers or mixed.

The electron injecting and transporting compounds which can be used herein include quinoline derivatives including organic metal complexes having 8-quinolinol or a derivative thereof as a ligand such as tris(8-quinolinolato)aluminum (Alq3), oxadiazole derivatives, perylene derivatives, pyridine derivatives, pyrimidine derivatives, quinoxaline derivatives, diphenylquinone derivatives, and nitrosubstituted fluorene derivatives. The light emitting layer can also serve as the electron transporting layer. In this case, use of tris(8-quinolinolato)aluminum etc. is preferred.

In forming the light emitting layer, vacuum evaporation is preferably used because homogeneous thin films are available. By utilizing vacuum evaporation, there is obtained a homogeneous thin film which is amorphous or has a crystal grain size of less than 0.2 $\mu$m. If the grain size is more than 0.2 $\mu$m, uneven light emission would take place and the drive voltage of the device must be increased with a substantial drop of hole injection efficiency.

The conditions for vacuum evaporation are not critical although a vacuum of $10^{-4}$ Pa or lower and a deposition rate of about 0.01 to 1 nm/sec. are preferred. It is preferred to successively form layers in vacuum because the successive formation in vacuum can avoid adsorption of impurities on the interface between the layers, thus ensuring better performance. Also, the drive voltage of a device can be reduced and the development and growth of dark spots be restrained.

In the embodiment wherein the respective layers are formed by vacuum evaporation, where it is desired for a single layer to contain two or more compounds, boats having the compounds received therein are individually temperature controlled to achieve co-deposition.

Further preferably, a shield plate may be provided on the device in order to prevent the organic layers and electrodes from oxidation. In order to prevent the ingress of moisture, the shield plate is attached to the substrate through an adhesive resin layer for sealing. The sealing gas is preferably an inert gas such as argon, helium, and nitrogen. The sealing gas should preferably have a moisture content of less than 100 ppm, more preferably less than 10 ppm, especially less than 1 ppm. The lower limit of the moisture content is usually about 0.1 ppm though not critical.

The shield plate is selected from plates of transparent or translucent materials such as glass, quartz and resins, with glass being especially preferred. Alkali glass is preferred because of economy although other glass compositions such as soda lime glass, lead alkali glass, borosilicate glass, aluminosilicate glass, and silica glass are also useful. Of these, plates of soda glass without surface treatment are inexpensive and useful. Beside the glass plates, metal plates and plastic plates may also be used as the shield plate.

Using a spacer for height adjustment, the shield plate may be held at a desired height over the layer structure. The spacer may be formed from resin beads, silica beads, glass beads, and glass fibers, with the glass beads being especially preferred. Usually the spacer is formed from particles having a narrow particle size distribution while the shape of particles is not critical. Particles of any shape which does not obstruct the spacer function may be used. Preferred particles have an equivalent circle diameter of about 1 to 20 $\mu$m, more preferably about 1 to 10 $\mu$m, most preferably about 2 to 8 $\mu$m. Particles of such diameter should preferably have a length of less than about 100 $\mu$m. The lower limit of length is not critical although it is usually equal to or more than the diameter.

When a shield plate having a recess is used, the spacer may be used or not. When used, the spacer should preferably have a diameter in the above-described range, especially 2 to 8 $\mu$m.

The spacer may be premixed in a sealing adhesive or mixed with a sealing adhesion at the time of bonding. The content of the spacer in the sealing adhesive is preferably 0.01 to 30% by weight, more preferably 0.1 to 5% by weight.

Any of adhesives which can maintain stable bond strength and gas tightness may be used although UV curable epoxy resin adhesives of cation curing type are preferred.

In the organic EL structure of the invention, the substrate may be selected from amorphous substrates of glass and quartz and crystalline substrates of Si, GaAs, ZnSe, ZnS, GaP, and InP, for example. If desired, buffer layers of crystalline materials, amorphous materials or metals may be formed on such crystalline substrates. Metal substrates including Mo, Al, Pt, Ir, Au and Pd are also useful. Of these, glass substrates are preferred. Since the substrate is often situated on the light exit side, the substrate should preferably have a light transmittance as described above for the electrode.

A plurality of inventive devices may be arrayed on a plane. A color display is obtained when the respective devices of a planar array differ in emission color.

The substrate may be provided with a color filter film, a fluorescent material-containing color conversion film or a dielectric reflecting film for controlling the color of light emission.

The color filter film used herein may be a color filter as used in liquid crystal displays and the like. The properties of a color filter may be adjusted in accordance with the light emission of the organic EL device so as to optimize the extraction efficiency and color purity.

It is also preferred to use a color filter capable of cutting external light of short wavelength which is otherwise absorbed by the EL device materials and fluorescence conversion layer, because the light resistance and display contrast of the device are improved.

An optical thin film such as a multilayer dielectric film may be used instead of the color filter.

The fluorescence conversion filter film is to convert the color of light emission by absorbing electroluminescence and allowing the fluorescent material in the film to emit light. It is formed from three components: a binder, a fluorescent material, and a light absorbing material.

The fluorescent material used may basically have a high fluorescent quantum yield and desirably exhibits strong absorption in the electroluminescent wavelength region. In practice, laser dyes are appropriate. Use may be made of rhodamine compounds, perylene compounds, cyanine compounds, phthalocyanine compounds (including sub-phthalocyanines), naphthalimide compounds, fused ring hydrocarbon compounds, fused heterocyclic compounds, styryl compounds, and coumarin compounds.

The binder is selected from materials which do not cause extinction of fluorescence, preferably those materials which can be finely patterned by photolithography or printing technique. Also, where the filter film is formed on the substrate so as to be contiguous to the hole injecting electrode, those materials which are not damaged during deposition of the hole injecting electrode (such as ITO or IZO) are preferable.

The light absorbing material is used when the light absorption of the fluorescent material is short and may be omitted if unnecessary. The light absorbing material may also be selected from materials which do not cause extinction of fluorescence of the fluorescent material.

The organic EL device of the invention is generally of the dc or pulse drive type while it may be ac driven. The applied voltage is generally about 2 to 30 volts.

EXAMPLE

Examples of the invention are given below by way of illustration.

Example 1

A substrate of (7059) glass by Corning Glass Works was scrubbed using a neutral detergent. The substrate was then secured by a holder in a sputtering apparatus where a hole injecting electrode layer of ITO was formed by a DC magnetron sputtering process using a target of ITO oxide.

The substrate having ITO deposited thereon was subjected to ultrasonic washing with neutral detergent, acetone, and ethanol, pulled up from boiling ethanol, and dried. After the surface was further cleaned with $UV/O_3$, the substrate was secured by a holder in a spattering chamber, which was evacuated to a vacuum of $1 \times 10^{-4}$ Pa or lower.

Next, using a target of $SiO_2$, an inorganic insulative hole injecting layer was deposited to a thickness of 2 nm. The sputtering gas used was argon mixed with 5% of $O_2$. Sputtering conditions included a substrate temperature of 25° C., a deposition rate of 1 nm/min, an operating pressure of 0.5 Pa, and an input power of 5 $W/cm^2$. The hole injecting layer as deposited had a composition of $SiO_{1.9}$.

With the vacuum kept, tris(8-quinolinolato)aluminum (Alq3) and rubrene were evaporated at an overall deposition rate of 0.2 nm/sec to a thickness of 40 nm, forming a light emitting layer consisting of Alq3 doped with 5 vol % of rubrene.

Next, with the vacuum kept, the substrate was transferred to the sputtering apparatus where using a target obtained by mixing strontium oxide (SrO), lithium oxide ($Li_2O$), and silicon oxide ($SiO_2$) in the proportion:

SrO: 80 mol %,
$Li_2O$: 10 mol %, and
$SiO_2$: 10 mol %, based on the entire components, an inorganic electron injecting and transporting layer was deposited to a thickness of 0.8 nm. The sputtering conditions included a substrate temperature of 25° C., sputtering gas Ar, a deposition rate of 1 nm/min, an operating pressure of 0.5 Pa, and an input power of 5 $W/cm^2$. Specifically, the inorganic electron injecting and transporting layer was first deposited to a thickness of 0.4 nm while supplying the sputtering gas of 100% Ar at 100 SCCM and the inorganic electron injecting and transporting layer was then deposited to a thickness of 0.4 nm while supplying the sputtering gas of $Ar/O_2=1/1$ at 100 SCCM.

With the vacuum kept, Al was evaporated to a thickness of 20 nm to form a negative electrode.

Final sealing of a glass shield completed an organic EL device. As a comparative sample, an organic EL device was fabricated by evaporating polythiophene at a deposition rate of 0.1 nm/sec to a thickness of 10 nm by the evaporation process to form a hole injecting layer and evaporating TPD at a deposition rate of 0.1 nm/sec to a thickness of 20 nm to form a hole transporting layer instead of the above inorganic insulative hole injecting and transporting layer, further evaporating tris(8-quinolinolato)aluminum (Alq3) at a deposition rate of 0.2 nm/sec to a thickness of 30 nm by the evaporation process to form an electron injecting and transporting layer instead of the above inorganic electron injecting and transporting layer, and with the vacuum kept, evaporating MgAg (weight ratio 10:1) at a deposition rate of 0.2 nm/sec to a thickness of 200 nm to form an elctron injecting electrode.

An electric field was applied across the organic EL device in air, which exhibited diode characteristics. When biased to be positive on the ITO side and negative on the Al side, the current flow increased as the voltage increased. A distinct light emission was observed in an ordinary room as viewed from the shield side. When the device was repeatedly operated for light emission, no drop of luminance occurred.

An accelerated test was then carried out by driving the device at a constant current of 100 $mA/cm^2$ for determining the life. The comparative sample of the same construction except that the electron injecting and transporting layer was formed of a conventional organic material showed a luminance half-life of less than 300 hours whereas the inventive sample did not reduce its luminance to one half over 300 hours of operation.

Example 2

In Example 1, the main component and stabilizer of the inorganic electron injecting and transporting layer were changed from SrO to MgO, CaO or a mixture of these oxides, from $Li_2O$ to $K_2O$, $Rb_2O$, $K_2O$, $Na_2O$, $Cs_2O$ or a mixture of these oxides, and from $SiO_2$ to $GeO_2$ or a mixture of $SiO_2$ and $GeO_2$. Substantially equivalent results were obtained. Similar results were obtained when the negative electrode material was changed from Al to Ag, In, Ti, Cu, Au, Mo, W, Pt, Pd, Ni or an alloy thereof.

Example 3

An organic EL device was fabricated as in Example 1 except that in the step of depositing the inorganic insulative hole injecting layer in Example 1, the composition of the target was changed to $SiO_2$ and the flow rate of $O_2$ in the sputtering gas was changed to a mixing ratio of 5% relative to Ar so that the layer had a composition of $SiO_{1.9}$. On the lifetime test, substantially equivalent results were obtained.

Further, organic EL devices were similarly fabricated except that the composition of the target was changed to $SiO_2$ and the flow rate of $O_2$ in the sputtering gas was changed to a mixing ratio of 30% relative to Ar so that the layer had a composition of $SiO_{1.95}$; the composition of the target was changed to $GeO_2$ and the flow rate of $O_2$ in the sputtering gas was changed to a mixing ratio of 30% relative to Ar so that the layer had a composition of $GeO_{1.96}$; and the composition of the target was changed to $Si_{0.5}Ge_{0.5}O_2$ and the flow rate of $O_2$ in the sputtering gas was changed to a mixing ratio of 10% relative to Ar so that the layer had a composition of $Si_{0.5}Ge_{0.5}O_{1.92}$. On the test, substantially equivalent results were obtained.

Example 4

In the step of depositing the inorganic insulative hole injecting and transporting layer in Example 1, the layer was deposited to a thickness of 1 nm using a target of $SiO_2$ having 3 at % of Ni added thereto. The sputtering gas used was 50 sccm of argon and 5 sccm of $O_2$. Sputtering conditions included a substrate temperature of 25° C., a deposition rate of 1 nm/min, an operating pressure of 0.5 Pa, and an input power of 5 W/cm². The inorganic insulative hole injecting and transporting layer as deposited had a composition of $SiO_{1.9}$ containing 2.5 at % of Ni. Otherwise as in Example 1, an organic EL device was fabricated. The organic EL device was examined as in Example 1, with substantially equivalent results to Example 1.

Equivalent results were obtained when the composition of the inorganic insulative hole injecting layer in the above device was changed from $SiO_{1.9}$ containing 2.5 at % of Ni to $GeO_{1.9}$ containing 2.5 at % of Ni or $Si_{0.5}Ge_{0.5}O_{1.98}$ containing 2.5 at % of Ni.

Substantially equivalent lifetimes were obtained when Ni was replaced by the same amount of Sn or Cu. Equivalent results were obtained when Ni was replaced by Fe, Ru or Au.

BENEFITS OF THE INVENTION

According to the invention, organic EL devices having performance comparable to or more than prior art devices having a hole injecting and transporting layer or an electron injecting and transporting layer using organic materials, a long life, weather resistance, high stability, high efficiency, and low cost are realized.

Even when the light emitting layer consists of two or more layers, the manufacture is easy and the film interface has physical properties

What is claimed is:

1. An organic electroluminescent device comprising
   a substrate,
   a hole injecting electrode and a negative electrode formed on the substrate,
   a light emitting layer containing an organic material between the electrodes,
   an inorganic electron injecting and transporting layer between said light emitting layer and said negative electrode, and
   an inorganic insulative hole injecting and transporting layer between said light emitting layer and said hole injecting electrode,
   said inorganic electron injecting and transporting layer comprising at least one oxide selected from the group consisting of strontium oxide, magnesium oxide, calcium oxide, lithium oxide, rubidium oxide, potassium oxide, sodium oxide, and cesium oxide as a main component,
   said inorganic insulative hole injecting and transporting layer comprising silicon oxide or germanium oxide or a mixture of silicon oxide and germanium oxide as a main component, the main component having an average composition represented by the formula:

$(Si_{1-x}Ge_x)O_y$ wherein $0 \leq x \leq 1$ and $1.7 \leq y \leq 1.99$, as analyzed by Rutherford back-scattering.

2. The organic electroluminescent device of claim 1 wherein said inorganic insulative hole injecting and transporting layer further contains silicon oxide, germanium oxide or a mixture of silicon oxide and germanium oxide as a stabilizer.

3. The organic electroluminescent device of claim 1 wherein said negative electrode is formed of at least one metal element selected from the group consisting of Al, Ag, In, Ti, Cu, Au, Mo, W, Pt, Pd, and Ni.

4. The organic electroluminescent device of claim 1 wherein said inorganic insulative hole injecting layer contains up to 10 at % of at least one element selected from the group consisting of Cu, Fe, Ni, Ru, Sn, and Au.

5. The organic electroluminescent device of claim 2 wherein said inorganic electron injecting and transporting layer contains 80 to 99 mol % of the main component and 1 to 20 mol % of the stabilizer, based on the entire components.

6. The organic electroluminescent device of claim 1 wherein said inorganic electron injecting and transporting layer has a thickness of 0.1 to 2 nm.

7. The organic electroluminescent device of claim 1 wherein said inorganic insulative hole injecting and transporting layer has a thickness of 0.1 to 5 nm.

* * * * *